United States Patent
Ye et al.

(10) Patent No.: US 9,890,913 B2
(45) Date of Patent: Feb. 13, 2018

(54) ILLUMINATION DEVICE HAVING BROAD LIGHTING DISTRIBUTION

(71) Applicant: EPISTAR CORPORATION, Hsinchu (TW)

(72) Inventors: Zhi-Ting Ye, Tao-Yuan Hsien (TW); Fen-Ren Chien, Tao-Yuan Hsien (TW)

(73) Assignee: EPISTAR CORPORATION, Hsinchu (TW)

( * ) Notice: Subject to any disclaimer, the term of this patent is extended or adjusted under 35 U.S.C. 154(b) by 525 days.

(21) Appl. No.: 14/277,055

(22) Filed: May 14, 2014

(65) Prior Publication Data
US 2015/0330583 A1    Nov. 19, 2015

(51) Int. Cl.
| | | |
|---|---|---|
| *F21V 7/00* | (2006.01) | |
| *F21S 2/00* | (2016.01) | |
| *F21V 3/02* | (2006.01) | |
| *F21V 3/04* | (2006.01) | |
| *F21V 7/22* | (2006.01) | |
| *F21K 9/65* | (2016.01) | |
| *H01L 33/54* | (2010.01) | |
| *H01L 33/58* | (2010.01) | |

(52) U.S. Cl.
CPC ............. *F21S 2/00* (2013.01); *F21K 9/65* (2016.08); *F21V 3/02* (2013.01); *F21V 3/04* (2013.01); *F21V 7/22* (2013.01); *H01L 33/54* (2013.01); *H01L 33/58* (2013.01)

(58) Field of Classification Search
CPC ...... F21S 2/00; F21K 9/58; F21V 3/02; F21V 3/04; F21V 7/22
USPC .............. 362/296.01, 311.02, 235, 308
See application file for complete search history.

(56) References Cited

U.S. PATENT DOCUMENTS

| | | | | |
|---|---|---|---|---|
| 7,926,962 B2 * | 4/2011 | Tsai | ................ | G03B 15/02 362/16 |
| 2007/0097709 A1 * | 5/2007 | Hsieh | ................ | G02B 6/0038 362/620 |
| 2010/0079980 A1 * | 4/2010 | Sakai | ................ | G02B 6/0016 362/97.1 |
| 2012/0119638 A1 * | 5/2012 | Sato | ................ | H01L 33/644 313/46 |
| 2015/0167925 A1 | 6/2015 | Lin | | |

FOREIGN PATENT DOCUMENTS

| | | |
|---|---|---|
| CN | 101105271 A | 1/2008 |
| CN | 104075239 A | 10/2014 |
| CN | 104115050 A | 10/2014 |
| TW | M390408 U1 | 10/2010 |

* cited by examiner

*Primary Examiner* — Elmito Breval
*Assistant Examiner* — Jessica M Apenteng
(74) *Attorney, Agent, or Firm* — Patterson + Sheridan, LLP (57) ABSTRACT

An illumination device includes at least one semiconductor light emitting element, a supporting base, and a lamp housing. The semiconductor light emitting element is disposed on the supporting base. The lamp housing is disposed on the supporting base to cover the semiconductor light emitting element, and includes a first illuminating part and a lateral illuminating part surrounding the first illuminating part. A micro-structure is formed on a side of the first illuminating part and facing the semiconductor light emitting element for reflecting the light emitted from the semiconductor light emitting element.

12 Claims, 11 Drawing Sheets

ILLUMINATION DEVICE HAVING BROAD LIGHTING DISTRIBUTION

BACKGROUND OF THE INVENTION

1. Field of the Invention

The present invention relates to an illumination device, and more specifically, to an illumination device including a semiconductor light emitting element and a micro-structure and having broad lighting distribution.

2. Description of the Prior Art

As the growth of the technology, a light emitting diode (LED) is widespread inhuman life. LED has advantages such as fast response, small size, low pollution, low power consumption, high reliability, and long service life, and is applied for illumination or for displaying. A conventional illumination bulb, such as an incandescent bulb, can be replaced by an LED illumination device. However, a light beam emitted from the LED is a kind of directional light source, and is different from the traditional dispersive light source. This is the reason why it is hard to replace all conventional illumination bulbs by the conventional LED illumination devices.

Figure 1:
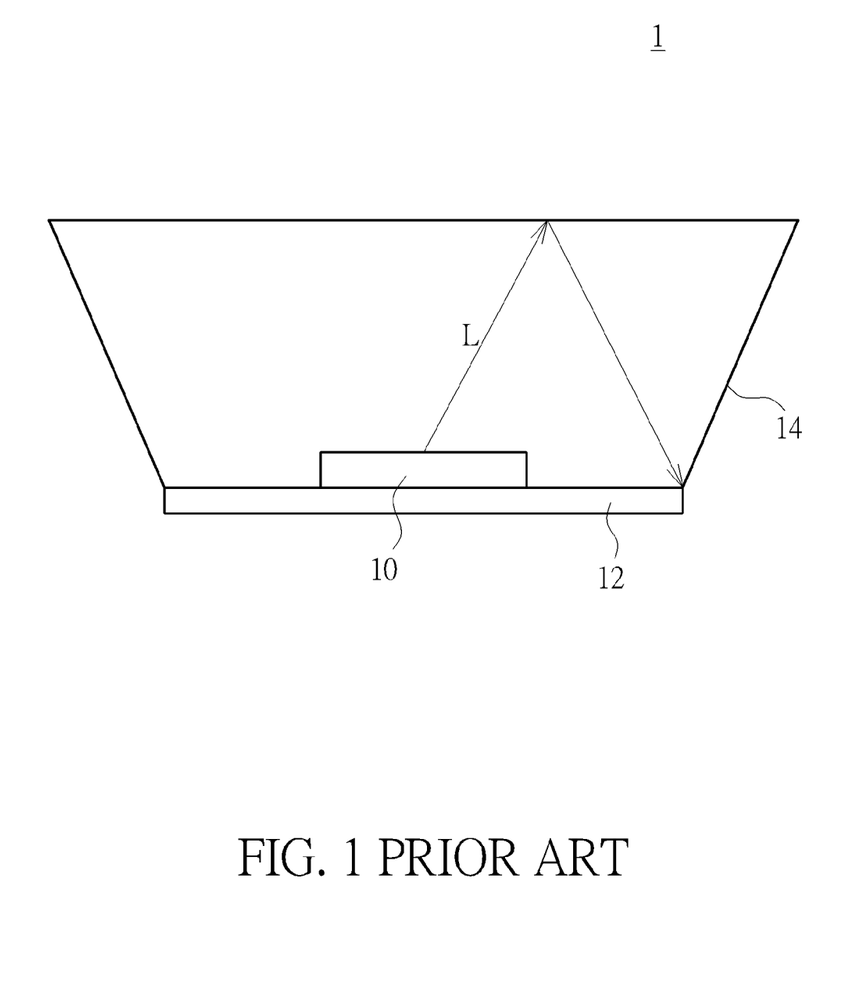
FIG. 1 is a conventional illumination device in the prior art.
Figure 2:
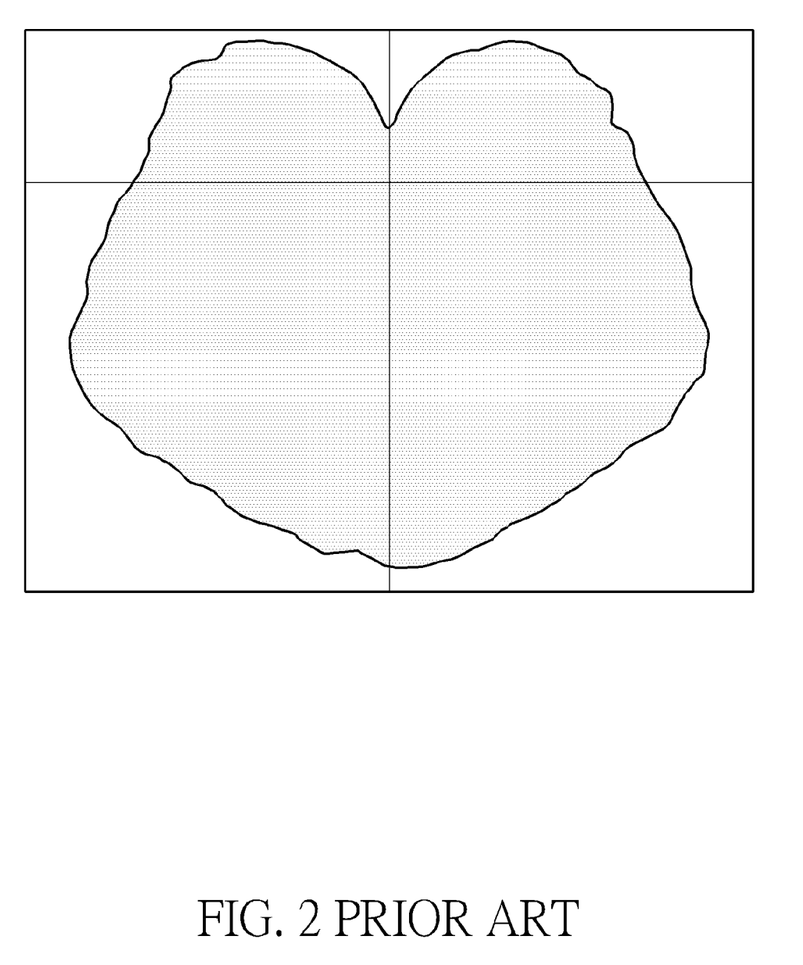
FIG. 2 is a lighting distribution curve chart of the conventional illumination device in the prior art.

Please refer to FIG. 1 and FIG. 2. FIG. 1 is a conventional illumination device 1 and FIG. 2 is a lighting distribution curve chart of the conventional illumination device 1. The conventional illumination device 1 includes a semiconductor light emitting element 10, a supporting base 12, and a lamp housing 14. The semiconductor light emitting element 10 includes at least one LED structure and emits light L. As shown in FIG. 2, the lighting distribution of the conventional illumination device 1 is narrow and limited. Hence, it is necessary to design an illumination device with wide reflection angle and better luminance.

SUMMARY OF THE INVENTION

The present invention relates to an illumination device, and more specifically, to an illumination device including a semiconductor light emitting element and a micro-structure and having broad lighting distribution, to solve the above-mentioned issue.

According to an embodiment of the present invention, an illumination device includes a semiconductor light emitting element, a supporting base and a lamp housing. The semiconductor light emitting element is disposed on the supporting base, and the lamp housing is disposed on the supporting base to cover the semiconductor light emitting element. The lamp housing includes a first illuminating part, a lateral illuminating part and a plurality of micro-structures. The lateral illuminating part surrounds the first illuminating part, and the micro-structures are disposed on one side of the first illuminating part and faced the semiconductor light emitting element. The micro-structures include a plurality of triangles symmetrically concentrically disposed corresponding to the semiconductor light emitting element in cross-section view. First angles $\theta_{11} \sim \theta_{n1}$ are respectively formed on tips of the triangles and second angles $\theta_{12} \sim \theta_{n2}$ are respectively formed on bottom corners of the triangles, wherein n is the number of the triangles. The first angles $\theta_{11} \sim \theta_{n1}$ of the triangles are equal to one another or gradually increased outward corresponding to the semiconductor light emitting element.

According to the embodiment of the present invention, the triangles are right triangles and the first angles range from 45 degrees to 65 degrees.

According to the embodiment of the present invention, the nth first angles $\eta_{n1}$ is set according to a formula, $\theta_{n1} = \theta_{11} r^{n-1}$, wherein r ranges from 1.01 to 1.15.

According to the embodiment of the present invention, the triangles are isosceles triangles and the first angles range from 90 degrees to 145 degrees.

According to the embodiment of the present invention, thickness of the micro-structures range from 3 μm to 15 μm.

According to the embodiment of the present invention, the triangles of the micro-structure are replaced by arc-shaped structures in cross-section view.

According to the embodiment of the present invention, a reflective film is coated on a surface of the micro-structure and the reflective film is a silver reflective film or a white reflective film.

According to the embodiment of the present invention, distances $P_1 \sim P_{n-1}$ between the adjacent triangles of the micro-structures are equal to one another or gradually increased outward corresponding to the semiconductor light emitting element.

According to the embodiment of the present invention, the (n−1)th distance $P_{n-1}$ is set according to a formula, $P_n = P_1 + (n-1)d$, wherein d ranges from 0.1 to 2 mm.

According to the embodiment of the present invention, the (n−1)th distance $P_{n-1}$ is set according to a formula, $P_n = P_1 r^{n-1}$, wherein r ranges from 1.01 to 1.05.

According to another embodiment of the present invention, an illumination device includes a semiconductor light emitting element, a supporting base and a lamp housing. The semiconductor light emitting element is disposed on the supporting base, and the lamp housing is disposed on the supporting base to cover the semiconductor light emitting element. The lamp housing includes a first illuminating part, a lateral illuminating part and a plurality of micro-structures. The lateral illuminating part surrounds the first illuminating part, and the micro-structures are disposed on one side of the first illuminating part and faced the semiconductor light emitting element. The micro-structures include a plurality of triangles symmetrically concentrically disposed corresponding to the semiconductor light emitting element in cross-section view. Distances $P_1 \sim P_{n-1}$ between the adjacent triangles of the micro-structures are equal to one another or gradually increased outward corresponding to the semiconductor light emitting element, wherein n is the number of the triangles.

According to the another embodiment of the present invention, the (n−1)th distance $P_{n-1}$ is set according to a formula, $P_n = P_1 + (n-1)d$, wherein d ranges from 0.1 to 2 mm.

According to the another embodiment of the present invention, the (n−1)th distance $P_{n-1}$ is set according to a formula, $P_n = P_1 r^{n-1}$, wherein r ranges from 1.01 to 1.05.

The illumination device of the present invention includes the micro-structures for increasing the reflection angle of the light emitted from the semiconductor light emitting element. The micro-structures are disposed on the first illuminating part so as to reflect the light downward to achieve abroad or an all-directional light distribution, and the shape and size of the micro-structures are optimized for better luminance. Accordingly, a luminance of the illumination device is enhanced and a lighting distribution of the illumination device is improved.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive.

Figure 3:
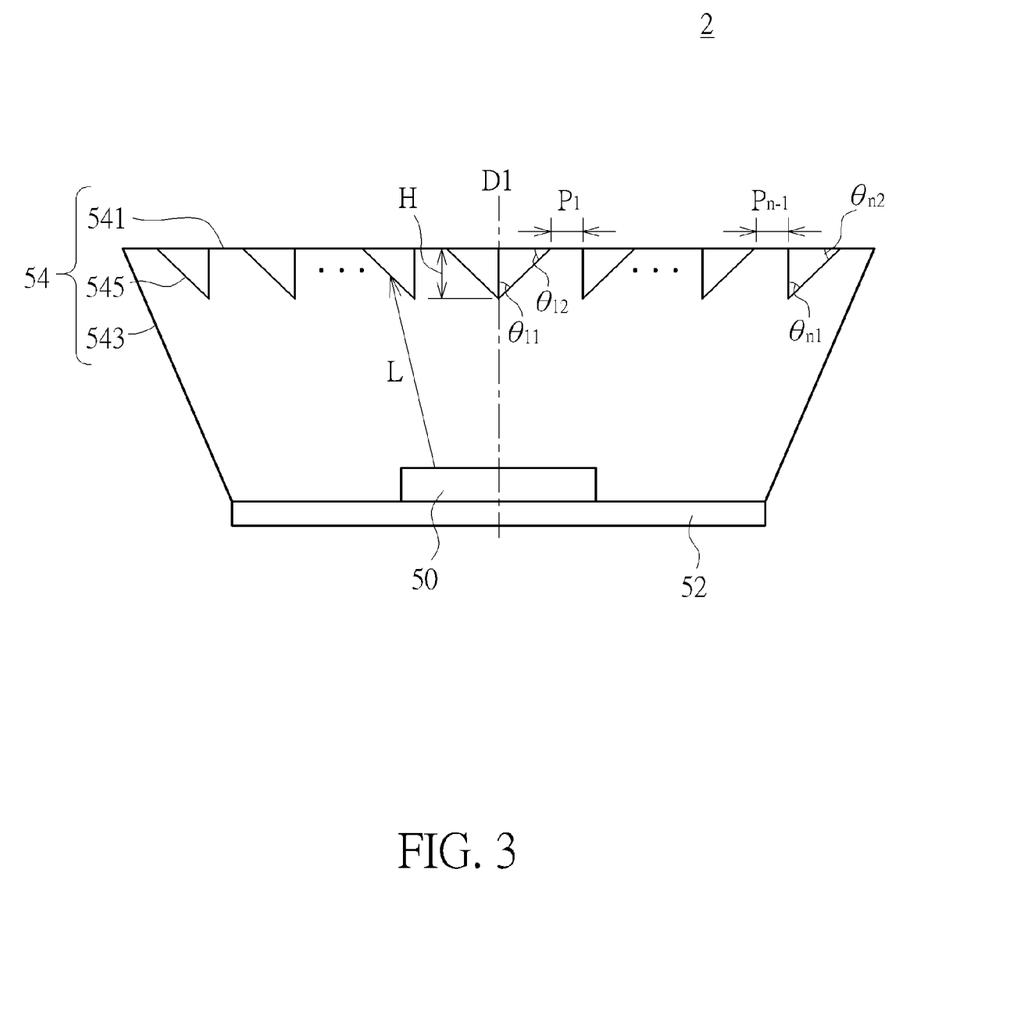
FIG. 3 is a cross-sectional diagram of an illumination device according to a first embodiment of the present invention.
Figure 4:
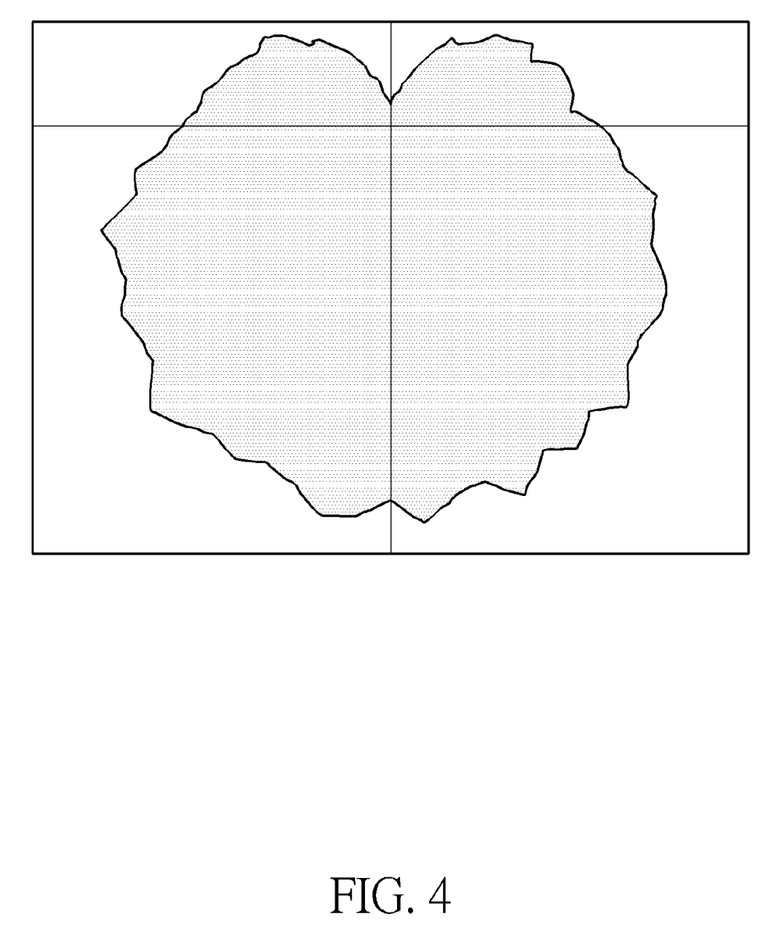
FIG. 4 is a lighting distribution curve chart of the illumination device according to the first embodiment of the present invention.

Please refer to FIG. 3 and FIG. 4. FIG. 3 is a cross-sectional diagram of an illumination device 2 according to a first embodiment of the present invention. FIG. 4 is a lighting distribution curve chart of the illumination device 2 according to the first embodiment of the present invention. The illumination device 2 includes at least one semiconductor light emitting element 50, a supporting base 52, and a lamp housing 54. The semiconductor light emitting element 50 is disposed on the supporting base 52 and emits light L, and the lamp housing 54 is disposed on the supporting base 52 to cover the semiconductor light emitting element 50. The lamp housing 54 includes a first illuminating part 541, a lateral illuminating part 543 surrounding the first illuminating part 541, and a plurality of micro-structures 545 disposed on one side of the first illuminating part 541 and facing the semiconductor light emitting element 50 for scattering at least apart of the light L toward multiple directions. Another side of the first illuminating part 541, corresponding to the side facing the semiconductor light emitting element 50, may include a plane or an approximate plane surface. The material of the lamp housing 54 may include polycarbonate and/or titanium dioxide. Accordingly, as shown in the lighting distribution curve chart of the illumination device 2 in FIG. 4, the luminance of the illumination device 2 at different view angles is greater than the luminance of the conventional illumination device 1 in prior art as shown in FIG. 2.

According to the cross-section view of the micro-structures 545 shown in FIG. 3, the micro-structures 545 may include a plurality of V-cut sections and a plurality of triangles, wherein the V-cut sections and the triangles are symmetrically concentrically disposed corresponding to the semiconductor light emitting element 50 or a central axis D1 of the first illuminating part 541. The triangles and the V-cut sections are alternately disposed on the first illuminating part 541. The triangles may be right triangles. Please refer to the right part of the cross-section view of the illumination device 2 shown in FIG. 3, first angles $\theta_{11}\sim\theta_{n1}$ are respectively formed on tips of the triangles of the micro-structures 545, and second angles $\theta_{12}\sim\theta_{n2}$ are respectively formed on bottom corners of the triangles of the micro-structures 545, wherein n is the number of the triangles. To prevent the luminance near to the central axis D1 may be greater than the luminance away from the central axis D1, the first angles $\theta_{11}\sim\theta_{n1}$ may be equal to one another or gradually increased outward corresponding to the semiconductor light emitting element 50, so that light illuminated from the illumination device 2 according to the present invention can be more uniform. Particularly the first angles $\theta_{11}\sim\theta_{n1}$ may range from 45 degrees to 65 degrees. Accordingly, the second angles $\theta_{12}\sim\theta_{n2}$ may be equal to one another or gradually decreased outward from a central axis D1, and range from 25 degrees to 45 degrees. In addition, according to some embodiments of the present invention, the numeric of the first angles $\theta_{11}\sim\theta_{n1}$ may be a geometric sequence, so that the nth first angle $\theta_{n1}$ can be set according to a formula, $\theta_{n1}=\theta_{11}r^{n-1}$, wherein n is the number of the triangles, and r may range from 1.01 to 1.15. Preferably, r may be equal or near to 1.02.

In addition, the thickness H of the micro-structures 545 may range from 3 μm to 15 μm, and distances between the adjacent triangles of the micro-structures 545, $P_1\sim P_{n-1}$, are equal to one another or gradually increased outward corresponding to the semiconductor light emitting element 50. Specifically, the numeric of the distances $P_1\sim P_{n-1}$ may be an arithmetic sequence, so that the (n−1)th distance $P_{n-1}$ can be set according to a formula, $P_n=P_1+(n-1)d$, wherein n is the number of the triangles, and d ranges from 0.1 mm to 2 mm. Preferably, d may be equal or near to 0.2. According to some embodiments of the present invention, the numeric of the distances $P_1\sim P_{n-1}$ may be a geometric sequence, so that the (n−1)th distance $P_{n-1}$ can be set according to a formula, $P_n=P_1r^{n-1}$, wherein n is the number of the triangles, and r ranges from 1.01 to 1.3. Preferably, r may be equal or near to 1.05.

Figure 5:
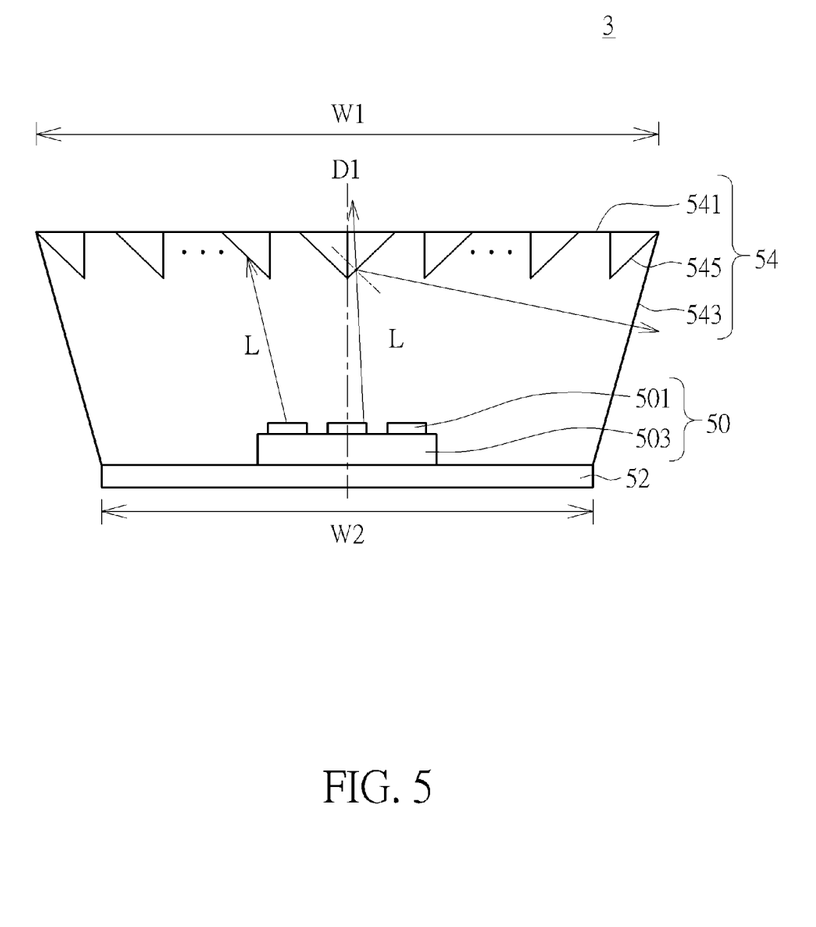
FIG. 5 is a cross-sectional diagram of an illumination device according to a second embodiment of the present invention.

Please refer to FIG. 5. FIG. 5 is a cross-sectional diagram of an illumination device 3 according to a second embodiment of the present invention. In contrast to the first embodiment of the present invention, the semiconductor light emitting element 50 of the illumination device 3 may further include a plurality of light emitting diode (LED) structures 501 and a submount 503. The LED structures 501 are disposed on the submount 503 for emitting light L. For efficiently directly conducting and dispersing heat generated from the LED structures 501, the material of the submount 503 may include metal, ceramic, sapphire or SiC.

Furthermore, according to embodiments of the present invention, a diameter W1 of the first illuminating part 541 is greater than a diameter W2 of the supporting base 52, and a ratio of W1 to W2 (W1/W2) may range from 1.05 to 1.5, as shown in FIG. 5, then the illumination device of the present invention can have preferable illuminating performance. Preferably, the ratio of W1 to W2 (W1/W2) may be equal or near to 1.23.

Figure 6:
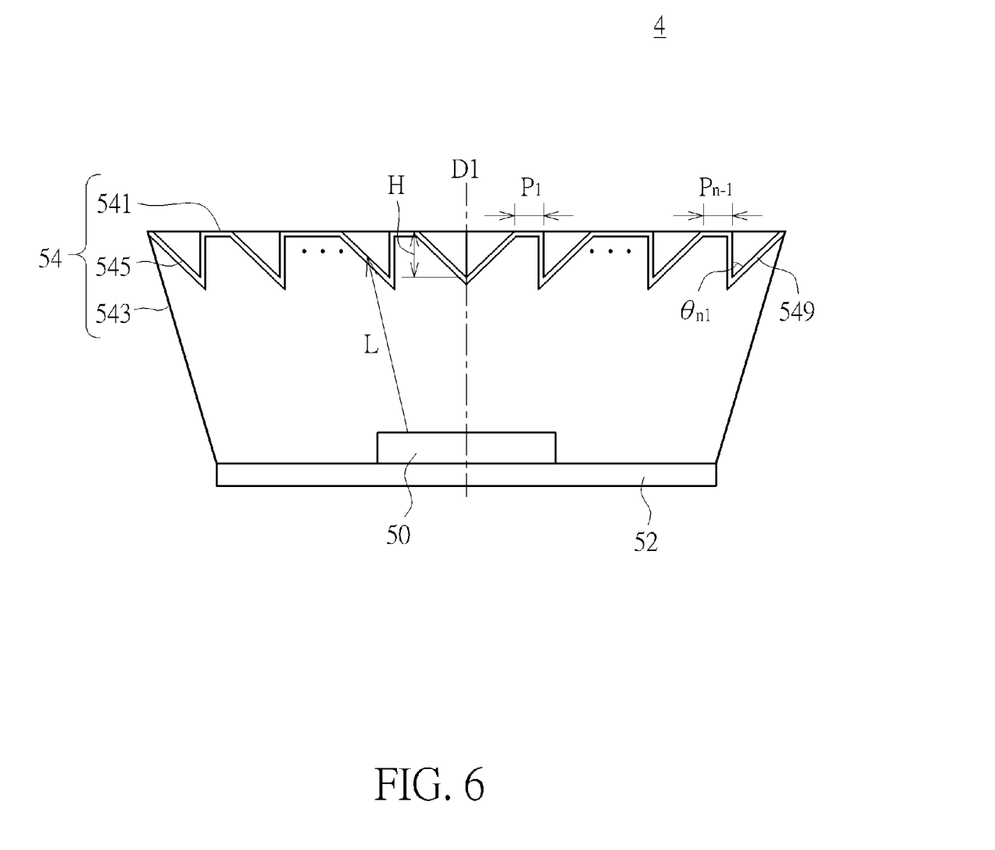
FIG. 6 is a cross-sectional diagram of an illumination device according to a third embodiment of the present invention.
Figure 7:
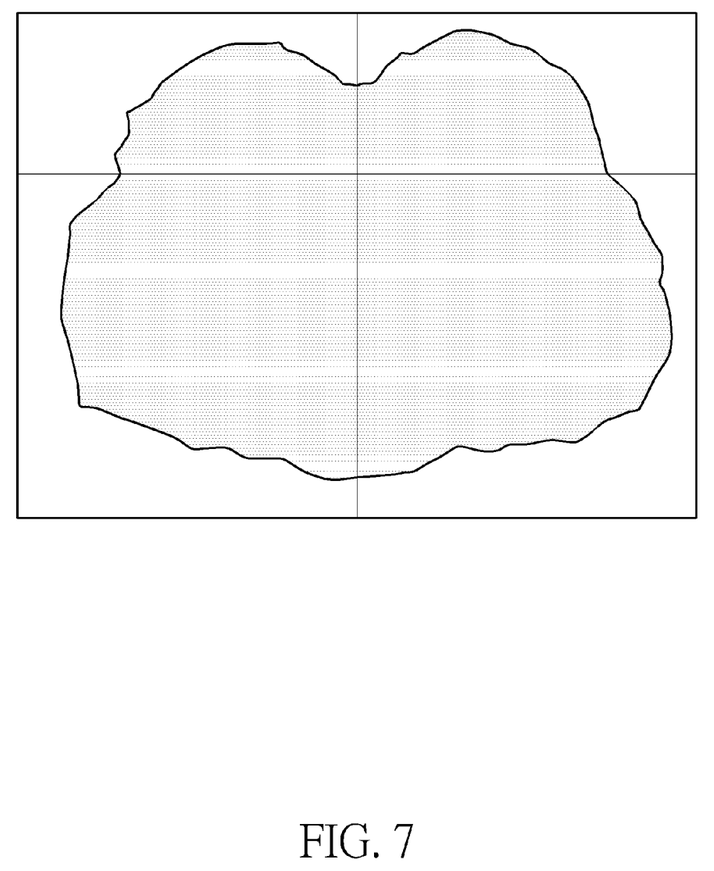
FIG. 7 is a lighting distribution curve chart of the illumination device according to the third embodiment of the present invention.

Please refer to FIG. 6 and FIG. 7. FIG. 6 is a cross-sectional diagram of an illumination device 4 according to a third embodiment of the present invention. FIG. 7 is a lighting distribution curve chart of the illumination device 4 according to the third embodiment of the present invention. As shown in FIG. 6, in contrast to the above embodiments of the present invention, the illumination device 4 may further include a reflective film 549 coated on a surface of the micro-structures 545 of the lamp housing 54. So that at least a part of the light L emitted from the semiconductor light emitting element 50 may be reflected and toward the lateral illuminating part 543 of the lamp housing 54. Accordingly, the luminance of the illumination device 4 at lateral side can be improved as shown in the lighting distribution curve chart in FIG. 7. In other words, the lighting distribution of the illumination device 4 can be more dispersive than the lighting distribution of the illumination device without coating a reflective film 549. The reflective film 549 can be a silver reflective film or a white reflective film.

Figure 8:
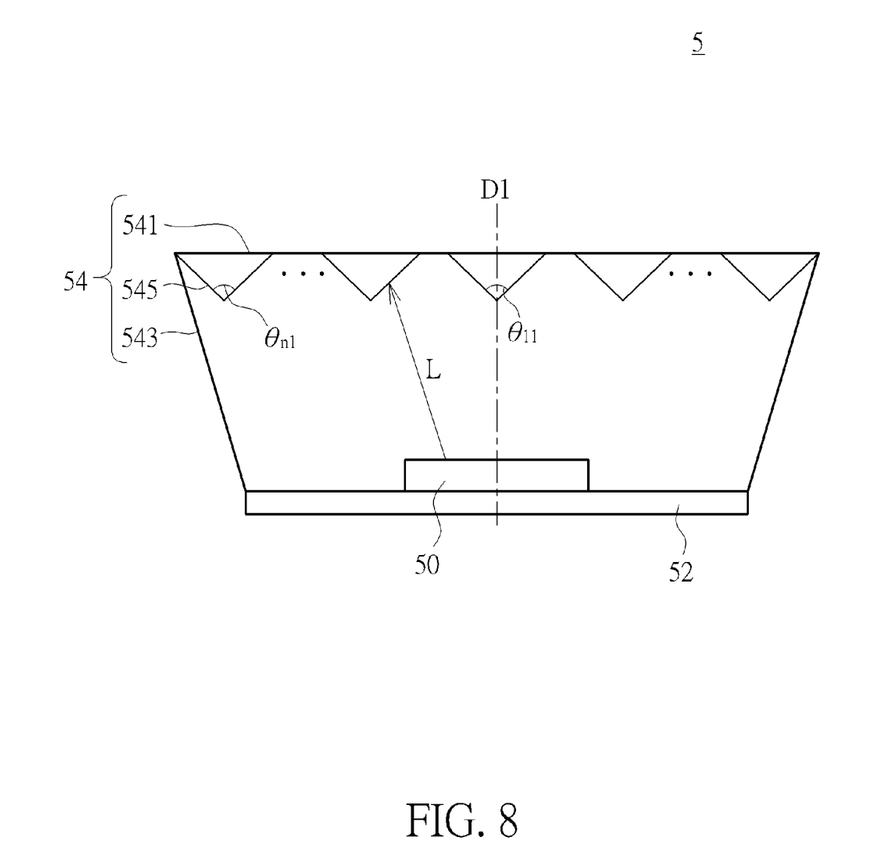
FIG. 8 is a cross-sectional diagram of an illumination device according to a fourth embodiment of the present invention.
Figure 9:
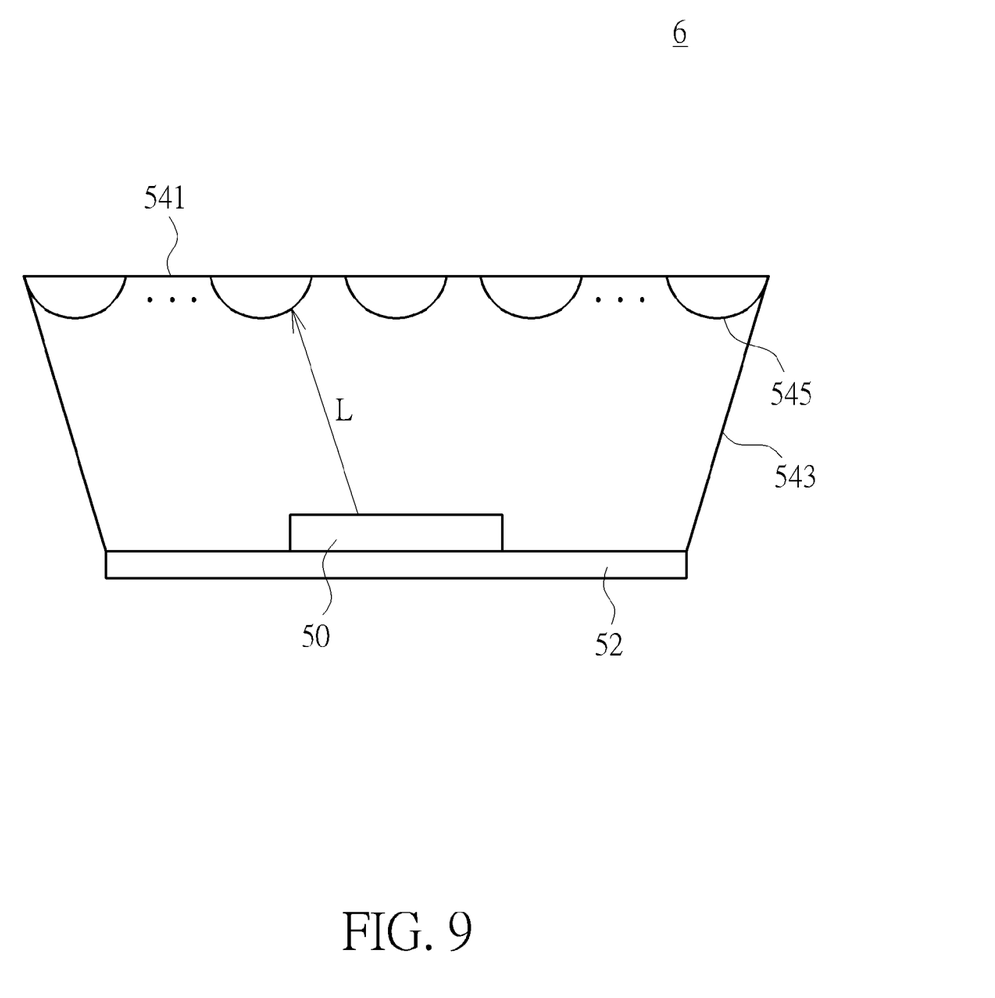
FIG. 9 is a cross-sectional diagram of an illumination device according to a fifth embodiment of the present invention.

Please refer to FIG. 8 and FIG. 9. FIG. 8 is a cross-sectional diagram of an illumination device 5 according to a fourth embodiment of the present invention. FIG. 9 is a cross-sectional diagram of an illumination device 6 according to a fifth embodiment of the present invention. In contrast to the above embodiments of the present invention, the shape of the micro-structures 545 of the illumination device 5, 6 may be different. As shown in FIG. 8, the triangles of the micro-structures 545 of the illumination device 8 may be isosceles triangles. In addition, the first angles $\theta_{11} \sim \theta_{n1}$ may range from 90 degrees to 145 degrees. As shown in FIG. 9, the triangles of the micro-structures 545 of the illumination device 9 may be replaced by arc-shaped structures.

Figure 10:
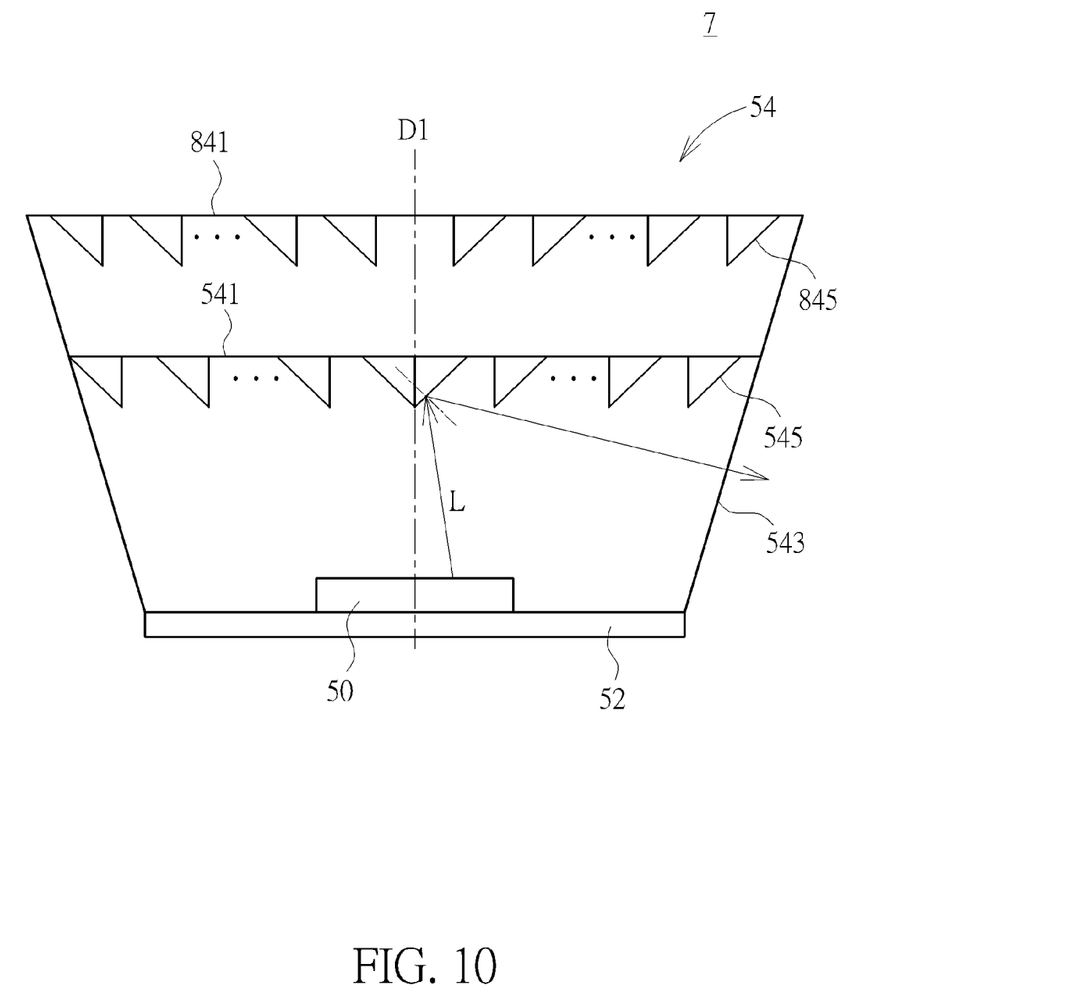
FIG. 10 is a cross-sectional diagram of an illumination device according to a sixth embodiment of the present invention.

Please refer to FIG. 10. FIG. 10 is a cross-sectional diagram of an illumination device 7 according to a sixth embodiment of the present invention. In contrast to the above embodiments of the present invention, the lamp housing 54 of the illumination device 7 may further include a second illuminating part 841 above the first illuminating part 541. At least a part of the lateral illuminating part 543 couples the first illuminating part 541 and the second illuminating part 841, and surrounds a space which is formed between the first illuminating part 541 and the second illuminating part 841. The second illuminating part 841 includes a plurality of micro-structures 845 disposed on a side of the second illuminating part 841 and faced the semiconductor light emitting element 50. The micro-structures 845 can reflect at least a part of the light which is emerged from the first illuminating part 541. Another side of the second illuminating part 841, corresponding to the side facing the semiconductor light emitting element 50, may include a plane or an approximate plane surface. In addition, the micro-structures 845 may be alternately arranged corresponding to the micro-structures 545. In other words, the triangles of the micro-structures 845 may not align the triangles of the micro-structures 545. Because the structure and the function of the second illuminating part 841 may be similar to the first illuminating part 541, the reflection of the light L may be increased and the lighting distribution of the illumination device 7 can be broader.

Figure 11:
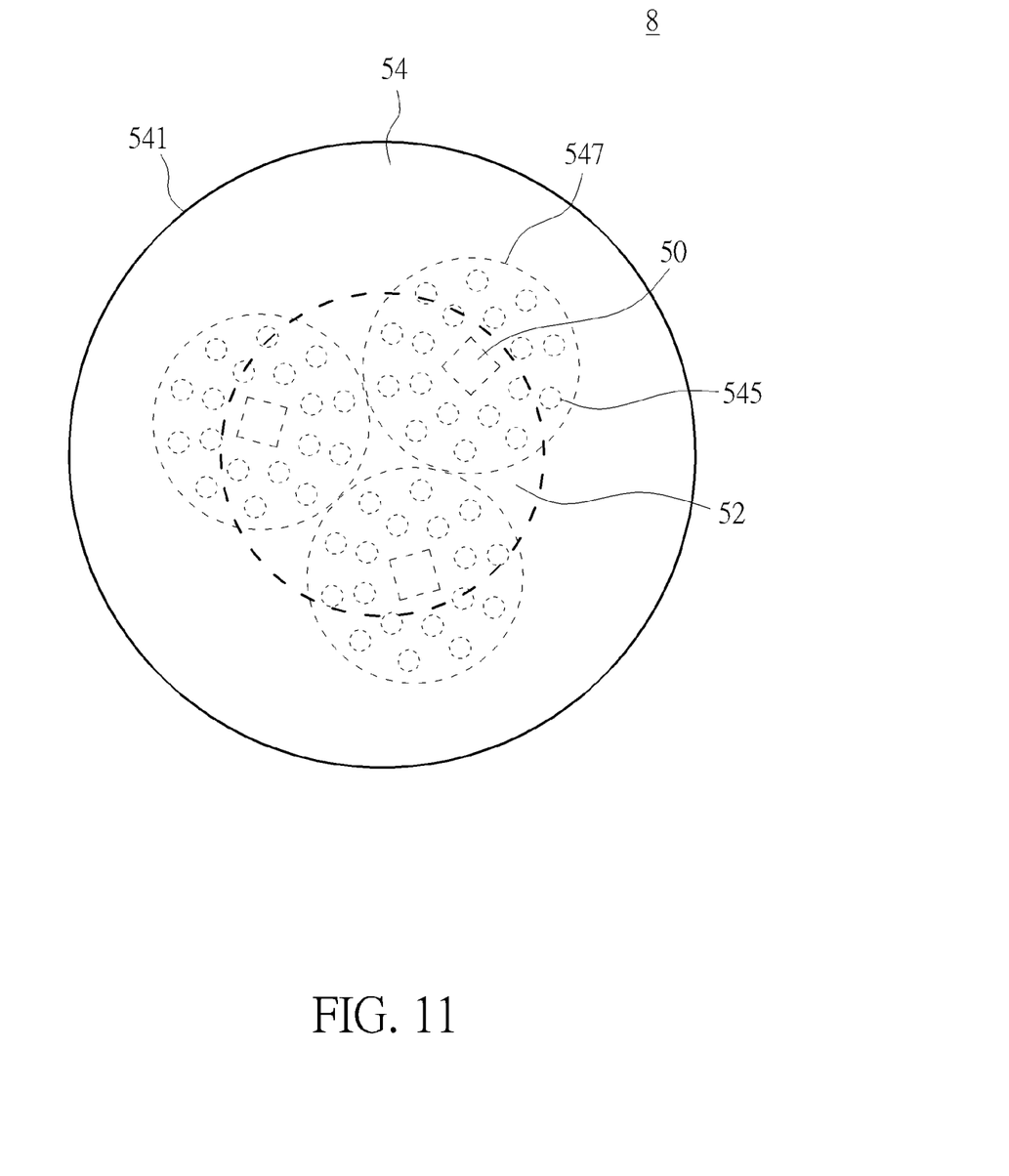
FIG. 11 is a top view of an illumination device according to a seventh embodiment of the present invention.

Please refer to FIG. 11. FIG. 11 is a top view of an illumination device 8 according to the seventh embodiment of the present invention. In contrast to the above embodiments of the present invention, the illumination device 8 may include a plurality of semiconductor light emitting elements 50. The semiconductor light emitting elements 50 may be symmetrically disposed corresponding to a center part of the supporting base 52. The first illuminating part 541 or the second illuminating part 841 may be shaped as a circle, and the supporting base 52 may be shaped as a circle, square or other different shape corresponding to the shape of the illuminating part 541 or 841. The plurality of the micro-structures 545 (845) may be grouped into different reflection sections 547 (847). In cross-section view, each reflection section 547 (847) may include a plurality of V-cut sections and a plurality of triangles, wherein the V-cut sections and the triangles are symmetrically concentrically disposed corresponding to a central axis of the reflection section 547 (847). Specifically, according to the embodiment as shown in FIG. 11, the first illuminating part 541 or the second illuminating part 841 may include three reflection sections 547, wherein the central axis of each of the reflection sections 547 may correspondingly align at least one of semiconductor light emitting elements 50.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An illumination device, comprising:
a semiconductor light emitting element;
a supporting base, wherein the semiconductor light emitting element is disposed on the supporting base; and
a lamp housing disposed on the supporting base and covering the semiconductor light emitting element, the lamp housing comprising:
a first illuminating part;
a lateral illuminating part surrounding the first illuminating part; and
a plurality of micro-structures disposed on one side of the first illuminating part and facing the semiconductor light emitting element, wherein the micro-structures comprise a plurality of triangles symmetrically concentrically disposed corresponding to the semiconductor light emitting element in cross-section view;
wherein:
first angles $\theta_{11} \sim \theta_{n1}$ are respectively formed on tips of the triangles and second angles $\theta_{12} \sim \theta_{n2}$ are respectively formed on bottom corners of the triangles, n is the number of the triangles, and the nth first angle $\theta_{n1}$ is set according to a formula, $\theta_{n1} = \theta_{11} r^{n-1}$, wherein r ranges from 1.01 to 1.15; and
the first angles $\theta_{11} \sim \theta_{n1}$ are gradually increased outward corresponding to the semiconductor light emitting element.
2. The illumination device of claim 1, wherein the triangles are right triangles, and the first angles range from 45 degrees to 65 degrees.
3. The illumination device of claim 1, wherein a thickness of the micro-structures ranges from 3 μm to 15 μm.

4. The illumination device of claim 1, wherein the triangles are isosceles triangles and the first angles range from 90 degrees to 145 degrees.

5. The illumination device of claim 1, wherein the triangles are replaced by arc-shaped structures in cross-section view.

6. The illumination device of claim 1, wherein a reflective film is coated on a surface of the micro-structure and the reflective film is a silver reflective film or a white reflective film.

7. The illumination device of claim 1, wherein distances $P_1 \sim P_{n-1}$ between the adjacent triangles of the micro-structures are equal to one another or gradually increased outward corresponding to the semiconductor light emitting element.

8. The illumination device of claim 7, wherein the (n−1)th distance $P_{n-1}$ is set according to a formula, $P_n = P_1 + (n-1)d$, wherein d ranges from 0.1 to 2 mm.

9. The illumination device of claim 7, wherein the (n−1)th distance $P_{n-1}$ is set according to a formula, $P_n = P_1 r^{n-1}$, wherein r ranges from 1.01 to 1.05.

10. An illumination device, comprising:
a semiconductor light emitting element;
a supporting base, wherein the semiconductor light emitting element is disposed on the supporting base; and
a lamp housing disposed on the supporting base and covering the semiconductor light emitting element, the lamp housing comprising:
a first illuminating part;
a lateral illuminating part surrounding the first illuminating part; and
a plurality of micro-structures disposed on one side of the first illuminating part and facing the semiconductor light emitting element, wherein the micro-structures comprise a plurality of triangles symmetrically concentrically disposed corresponding to the semiconductor light emitting element in cross-section view;
wherein:
distances $P_1 \sim P_{n-1}$ between the adjacent triangles of the micro-structures are gradually increased outward corresponding to the semiconductor light emitting element, n is the number of the triangles, and the (n−1)th distance $P_{n-1}$ is set according to a formula, $P_n = P_1 + (n-1)d$, wherein d ranges from 0.1 to 2 mm.

11. The illumination device of claim 10, wherein a thickness of the micro-structures ranges from 3 μm to 15 μm.

12. An illumination device, comprising:
a semiconductor light emitting element;
a supporting base, wherein the semiconductor light emitting element is disposed on the supporting base; and
a lamp housing disposed on the supporting base and covering the semiconductor light emitting element, the lamp housing comprising:
a first illuminating part;
a lateral illuminating part surrounding the first illuminating part; and
a plurality of micro-structures disposed on one side of the first illuminating part and facing the semiconductor light emitting element, wherein the micro-structures comprise a plurality of triangles symmetrically concentrically disposed corresponding to the semiconductor light emitting element in cross-section view;
wherein:
distances $P_1 \sim P_{n-1}$ between the adjacent triangles of the micro-structures are gradually increased outward corresponding to the semiconductor light emitting element, n is the number of the triangles, and the (n−1)th distance $P_{n-1}$ is set according to a formula, $P_n = P_1 r^{n-1}$, wherein r ranges from 1.01 to 1.05.

* * * * *